(12) United States Patent
Wang

(10) Patent No.: US 11,925,090 B2
(45) Date of Patent: Mar. 5, 2024

(54) OLED DISPLAY PANEL INCLUDING PHOTORESIST HAVING STACKED DEFINING LAYERS AND DISPLAY DEVICE

(71) Applicant: Wuhan China Star Optoelectronics Semiconductor Display Technology Co., Ltd., Wuhan (CN)

(72) Inventor: Lei Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/047,121

(22) PCT Filed: Jun. 23, 2020

(86) PCT No.: PCT/CN2020/097645
§ 371 (c)(1),
(2) Date: Oct. 13, 2020

(87) PCT Pub. No.: WO2021/223300
PCT Pub. Date: Nov. 11, 2021

(65) Prior Publication Data
US 2023/0112002 A1    Apr. 13, 2023

(30) Foreign Application Priority Data

May 8, 2020   (CN) .......................... 202010382499.2

(51) Int. Cl.
*H10K 59/38*    (2023.01)
*G02B 5/20*    (2006.01)
(Continued)

(52) U.S. Cl.
CPC ........... *H10K 59/38* (2023.02); *H10K 50/865* (2023.02); *H10K 59/1201* (2023.02); *H10K 59/122* (2023.02); *H10K 71/00* (2023.02)

(58) Field of Classification Search
CPC ........... H10K 59/38; H10K 59/32–353; H10K 50/865; H10K 59/8792; H10K 59/1201;
(Continued)

(56) References Cited

U.S. PATENT DOCUMENTS

| 2001/0007733 | A1 | 7/2001 | Matsuyama |
| 2016/0372528 | A1* | 12/2016 | Kamura ................ H01L 31/055 |
| 2019/0386253 | A1 | 12/2019 | Li |

FOREIGN PATENT DOCUMENTS

| CN | 102636904 A | 8/2012 |
| CN | 105785630 A | 7/2016 |

(Continued)

OTHER PUBLICATIONS

Korean Office Action issued in corresponding Korean Patent Application No. 10-2021-7006080 dated Jul. 18, 2023, pp. 1-4.

*Primary Examiner* — Sonya McCall-Shepard
(74) *Attorney, Agent, or Firm* — Nathan & Associates; Menachem Nathan

(57) ABSTRACT

An OLED display panel and a display device are provided. A photoresist structure of a color filter layer is a stack of two defining layers, a sloped surface is defined between corresponding defining areas of two defining layers, and a color resist unit of the color filter layer is formed in corresponding color resist defining areas and corresponds to a light-emitting unit, which reduces a usage of color filter materials and prevents solvent volatilizing to the environment by using solvent-free color filter materials.

20 Claims, 5 Drawing Sheets

(51) Int. Cl.
*H10K 50/125* (2023.01)
*H10K 50/844* (2023.01)
*H10K 50/86* (2023.01)
*H10K 59/122* (2023.01)
*H10K 59/35* (2023.01)
*H10K 59/80* (2023.01)
*H10K 71/00* (2023.01)
*H10K 59/12* (2023.01)

(58) Field of Classification Search
CPC ...... H10K 59/122; H10K 59/10; H10K 59/12; H10K 50/86; G02B 5/201
See application file for complete search history.

(56) References Cited

FOREIGN PATENT DOCUMENTS

| | | |
|---|---|---|
| CN | 107731873 A | 2/2018 |
| CN | 108922914 A | 11/2018 |
| CN | 110211997 A | 9/2019 |
| CN | 110246872 A | 9/2019 |
| CN | 110707132 A | 1/2020 |
| CN | 110707138 A | 1/2020 |
| KR | 20150123802 A | 11/2015 |

* cited by examiner

OLED DISPLAY PANEL INCLUDING PHOTORESIST HAVING STACKED DEFINING LAYERS AND DISPLAY DEVICE

TECHNICAL FIELD

The present disclosure relates to the field of printing display technology, and in particular, to an OLED display panel and a display device.

BACKGROUND

As the rapid development of organic light-emitting diode (OLED) display technology has led to the rapid entry of curved and flexible display products into the market, the technologies in relevant fields have also advanced rapidly. OLEDs are a kind of diode element using organic light-emitting materials driven through electric fields to emit light by means of carrier injections and recombination. OLED elements have attracted wide attention due to their advantages of light weight, thinness, flexibility, and wide viewing angles.

Polarizers (POL), which can effectively reduce reflectivity of panels in bright light, lose nearly 58% of their output light, greatly increasing an OLED panel's lifetime burden. On the other hand, polarizers with large thicknesses and fragility are not conducive to the development of dynamic folding products. In order to develop dynamic folding products based on OLED display technology, new materials, new technologies, and new processes must be introduced to replace polarizers. Using color filters (CF) instead of polarizers is classified as polarizer-free (POL-less) technology.

As shown in FIG. 1A, which is a schematic diagram illustrating a comparison between effects of a POL-less display panel based on a color filter and a display panel based on a polarizer, arrows indicate directions of light emitted by the panels. As shown in part a of FIG. 1A, the POL-less display panel 10a based on the color filter comprises an array layer 11a, an organic light-emitting (EL) layer 12a, a thin film encapsulation (TFE) layer 13a, and a color filter (CF) layer 14a which are stacked in sequence, wherein a thickness H1 of the color filter layer 14a is about 2-3 µm, and a luminescent efficiency of the POL-less display panel 10a based on the color filter is greater than 60% and its reflectivity is greater than 6%. As shown in part b of FIG. 1A, the display panel 10b based on the polarizer comprises an array layer 11b, an organic light-emitting layer 12b, a thin film encapsulation layer 13a, and a polarizer 14b which are stacked in sequence, wherein a thickness H2 of the polarizer 14b is about 60 µm, and a luminescent efficiency of the display panel 10b based on the polarizer is about 42% and its reflectivity is about 5%.

As can be seen from FIG. 1A, in the POL-less display panel based on the color filter panel, not only a thickness of a functional layer can be reduced from about 60 µm to less than 5 µm, but also a luminescent efficiency can be improved from about 42% to more than 60%, and the reflectivity of the POL-less display panel based on the color filter is substantially the same as that of the display panel based on the polarizer.

POL-less technology based on color filters is considered as one of the key technologies for dynamic folding product development. A basic structure of a color filter comprises red (R), green (G), and blue (B) color resists and a black matrix (BM). Based on OLED's self-luminous characteristics, the color resists need to correspond to red, green, and blue light-emitting units of OLEDs respectively to form a functional color filter layer. In current POL-less technology, a photoetching process is needed, and a defining area (bank) manufactured by the current photoetching process is a layer of photoresist patterns, wherein a commonly used photoresist comprises BM materials.

Referring to FIG. 1B, which is a schematic diagram illustrating a photoresist pattern formed by the current photoetching process, a diameter D101 of a circular bank 101 is 27-28 µm, an edge L102 of a rounded rectangle 102 is 31-32 µm, and an edge L103 of another rounded rectangle bank 103 is 36-37 µm. The photoresist patterns formed by the photoetching process meet requirements of optical parameters of an RGB layer in a subsequent photoetching process.

However, due to needs of the photoetching process in the current POL-less technology, not only is there a large waste of materials, but also a certain environmental pollution caused by large amounts of solvent volatilizing during the photoetching process because photoetching materials themselves are materials with high solvent content.

SUMMARY

The present disclosure aims at providing an OLED display panel and a display device for the problems existing in current technology, which can realize manufacturing a color filter by printing, reduce a usage of color filter materials when printing requirements are met, avoid an effect of solvent volatilization to the environment by using solvent-free color filter materials, and enhance competitiveness of products.

An embodiment of the present disclosure provides an OLED display panel, comprising: an array layer; an organic light-emitting layer arranged on the array layer and comprising at least one light-emitting unit; and a color filter layer arranged on the organic light-emitting layer and comprising a photoresist structure and at least one color resist unit; wherein the photoresist structure comprises a first defining layer and a second defining layer, the first defining layer comprises at least one first color resist defining area, the second defining layer comprises at least one second color resist defining area at a position corresponding to the first color resist defining area, the first color resist defining area and the second color resist defining area have same shapes and are concentric, an opening of the second color resist defining area is larger than an opening of the first color resist defining area, and the second defining layer comprises a sloped surface defined between the first color resist defining area and the second color resist defining area; and the color resist unit is arranged in an area defined by the first color resist defining area and the second color resist defining area and corresponds to the light-emitting unit, and the color resist unit is arranged in the first color resist defining area and the second color resist defining area by ink-jet printing.

An embodiment of the present disclosure further provides an OLED display panel comprising: an array layer; an organic light-emitting layer arranged on the array layer and comprising at least one light-emitting unit; and a color filter layer arranged on the organic light-emitting layer and comprising a photoresist structure and at least one color resist unit; wherein the photoresist structure comprises a first defining layer and a second defining layer, the first defining layer comprises at least one first color resist defining area, the second defining layer comprises at least one second color resist defining area at a position corresponding to the first color resist defining area, an opening of the second color resist defining area is larger than an opening of the first color resist defining area, and the second defining layer comprises a sloped surface defined between the first color resist defining area and the second color resist defining area; and the color resist unit is arranged in an area defined by the first color resist defining area and the second color resist defining area and corresponds to the light-emitting unit.

An embodiment of the present disclosure further provides a display device comprising an OLED display panel, wherein the OLED display panel comprises: an array layer; an organic light-emitting layer arranged on the array layer and comprising at least one light-emitting unit; and a color filter layer arranged on the organic light-emitting layer and comprising a photoresist structure and at least one color resist unit; wherein the photoresist structure comprises a first defining layer and a second defining layer, the first defining layer comprises at least one first color resist defining area, the second defining layer comprises at least one second color resist defining area at a position corresponding to the first color resist defining area, an opening of the second color resist defining area is larger than an opening of the first color resist defining area, and the second defining layer comprises a sloped surface defined between the first color resist defining area and the second color resist defining area; and the color resist unit is arranged in an area defined by the first color resist defining area and the second color resist defining area and corresponds to the light-emitting unit.

In the embodiments of the present disclosure, the photoresist structure of the color filter layer is a stack of two defining layers, and the sloped surface is defined between corresponding defining areas of two defining layers, which is convenient for development of a subsequent ink-jet printing process, and realizes manufacturing the color filter layer by ink-jet printing. Compared with a manufacturing method for the color filter layer by the photoetching process, it can not only reduce a usage of color filter materials, but also avoid an effect of solvent volatilization to the environment due to using solvent-free color filter materials.

BRIEF DESCRIPTION OF DRAWINGS

To describe the technical solutions of the embodiments of the present disclosure more clearly, the following briefly introduces the accompanying drawings used in the description of the embodiments of the present disclosure. Apparently, the accompanying drawings described below illustrate only some exemplary embodiments of the present disclosure, and persons skilled in the art may derive other drawings from the drawings without making creative efforts.

DETAILED DESCRIPTION OF PREFERRED EMBODIMENTS

Figure 1A:
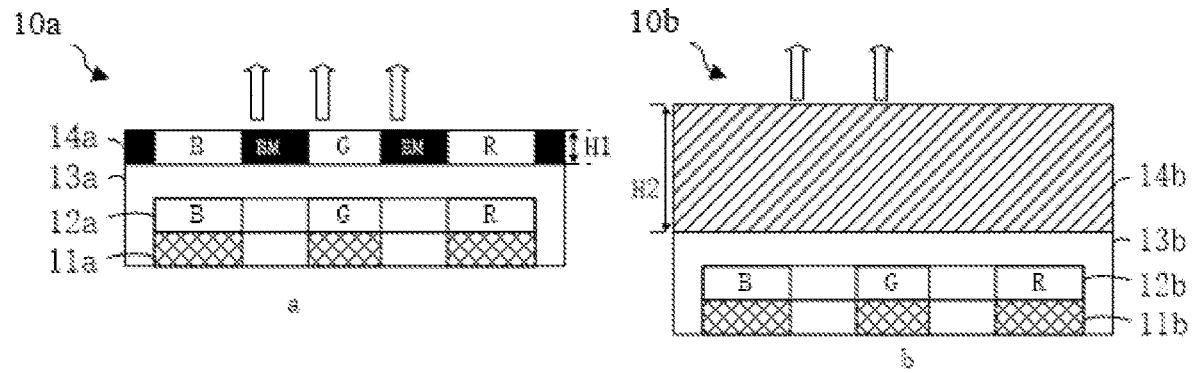
FIG. 1A is a schematic diagram illustrating a comparison between effects of a POL-less display panel based on a color filter and a display panel based on a polarizer.
Figure 1B:
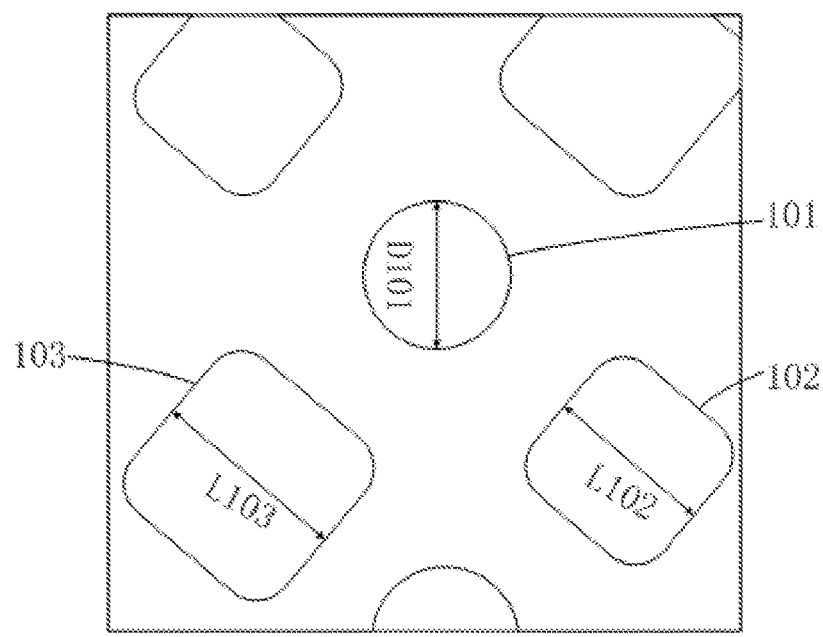
FIG. 1B is a schematic structural diagram illustrating a photoresist pattern formed by the current photoetching process.

Reference will now be made in detail to embodiments, examples of which are illustrated in the accompanying drawings. Wherein, same or similar reference numbers always represent the same or similar elements or elements with the same or similar functions. The terms "first", "second", "third", and the like (if any) in the description, claims, and drawings are used to distinguish between different objects, rather than used to indicate a specified order or sequence. It should be understood that the objects described in this way may be exchanged when appropriate. In description of the disclosure, "a plurality of" means two or more than two, unless otherwise specified. Furthermore, the terms "include" and "comprise" as well as any variants thereof are intended to cover a non-exclusive inclusion. Directional terms mentioned in the present disclosure, such as "top", "bottom", "front", "back", "left", "right", "inside", "outside", "side" etc., are only used with reference to orientations of the accompanying drawings.

In description of the present disclosure, it should be understood that, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

An embodiment of the present disclosure provides a photoresist structure of a color filter layer of an OLED display panel. The photoresist structure is adjusted and selected to be a stack of two defining layers, wherein an opening of a bottom defining area (bank) is smaller than an opening of a top defining area, corresponding banks of the two defining layers are concentric, and a sloped surface is defined between the corresponding banks of the two defining layers (an inclination angle [taper] of the top bank is smaller). In other words, the photoresist structure is narrow at the top and wide at the bottom in the defining areas, in order to limit ink overflow in all directions when printing color resist units of the color filter layer by ink-jet printing (IJP) technology, and to ensure ink droplets can slide down the sloped surface to a bottom of the banks in case of deviation in printing. In the embodiment of the present disclosure, the improved photoresist structure is adopted, which is convenient for development of the subsequent ink-jet printing process, and realizes manufacture of the color filter layer by ink-jet printing. Compared with the method of manufacturing the color filter layer by photoetching process, not only can it only reduce a usage amount of color filter materials, but also prevents solvent from volatilizing into the environment due to using solvent-free color filter materials.

Figure 2A:
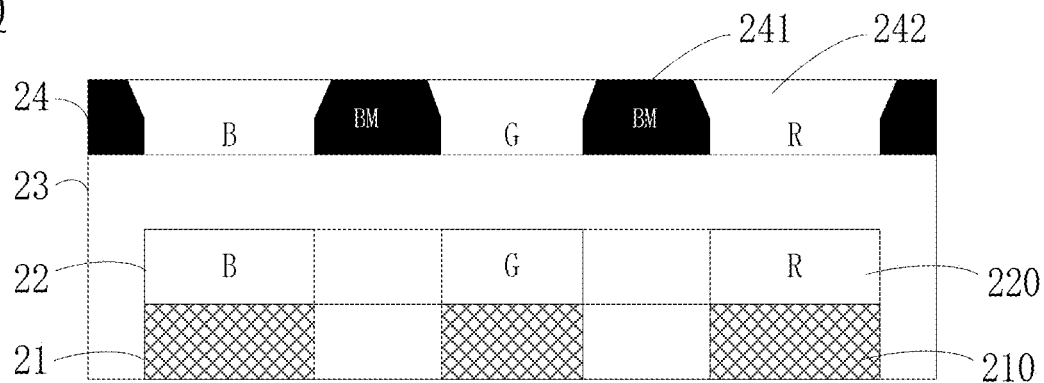
FIG. 2A is a schematic sectional structural diagram illustrating an OLED display panel according to an embodiment of the present disclosure.
Figure 2B:
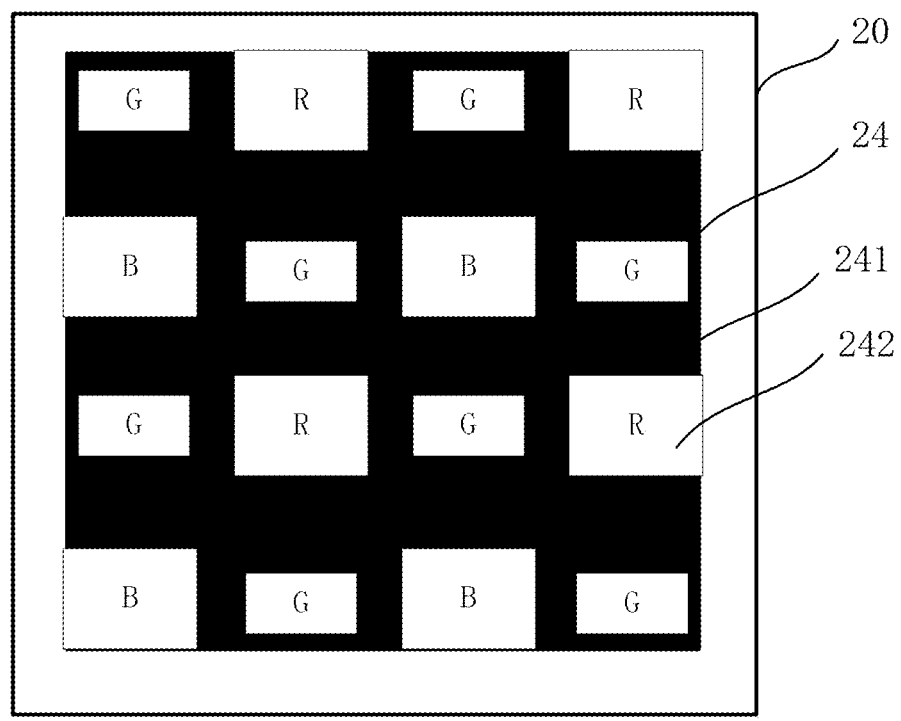
FIG. 2B is a top-down structural schematic diagram illustrating an OLED display panel according to an embodiment of the present disclosure.
Figure 3:
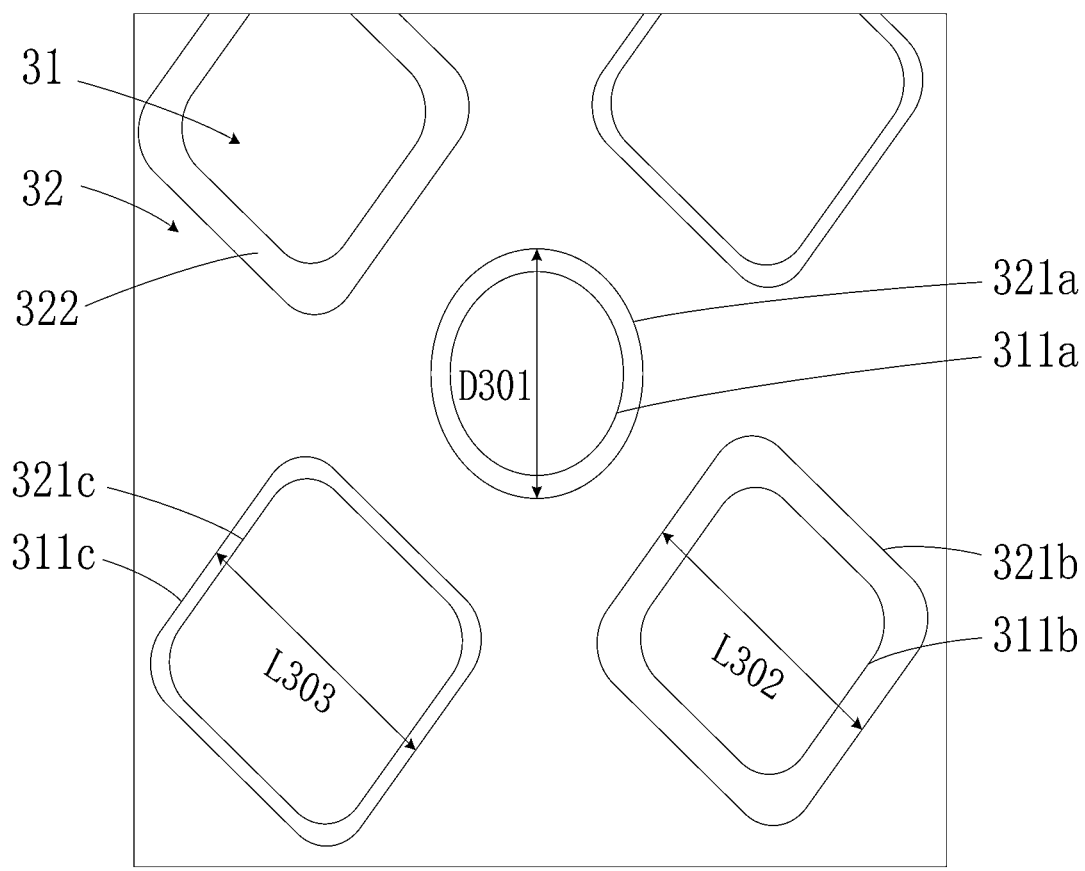
FIG. 3 is a top-down structural schematic diagram illustrating a photoresist structure according to an embodiment of the present disclosure.
Figure 4:
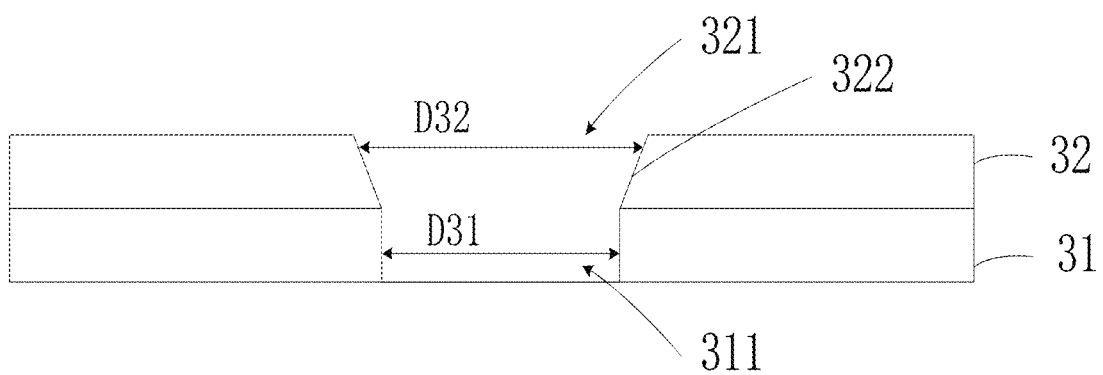
FIG. 4 is a sectional structural schematic diagram illustrating a photoresist structure according to an embodiment of the present disclosure.
Figure 5:
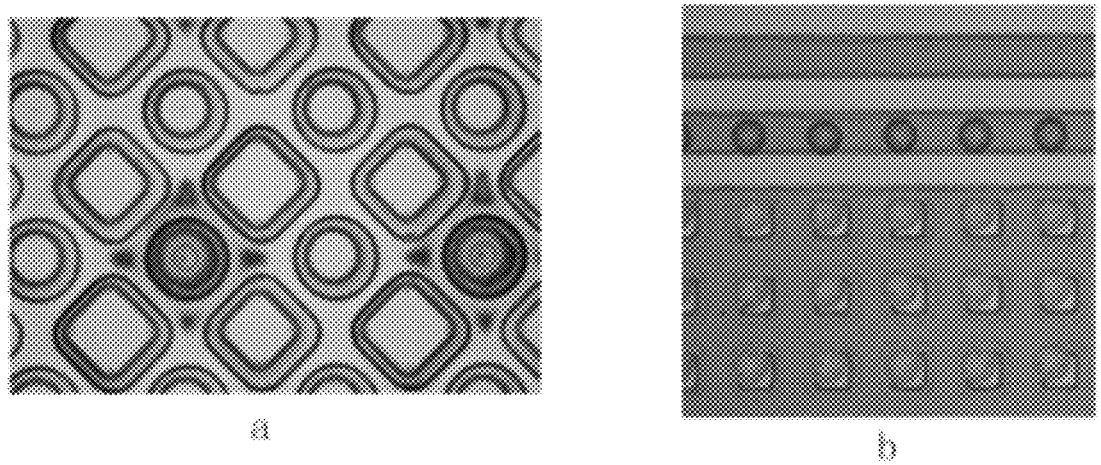
FIG. 5 is a diagram illustrating a comparison between printing effects of a photoresist structure according to an embodiment of the present disclosure and a current single-layer photoresist structure for ink-jet printing.

Please refer to FIG. 2A, FIG. 2B and FIG. 3 to FIG. 5 in combination, wherein FIG. 2A is a schematic sectional structural diagram illustrating an OLED display panel according to an embodiment of the present disclosure, FIG. 2B is a top-down structural schematic diagram illustrating an OLED display panel according to an embodiment of the present disclosure, FIG. 3 is a top-down structural schematic diagram illustrating a photoresist structure according to an embodiment of the present disclosure, FIG. 4 is a sectional structural schematic diagram illustrating a photoresist structure according to an embodiment of the present disclosure, and FIG. 5 is a diagram illustrating a comparison between printing effects of a photoresist structure according to an embodiment of the present disclosure and a current single-layer photoresist structure for ink-jet printing.

As shown in FIG. 2A and FIG. 2B, the OLED display panel in the embodiment of the present disclosure comprises an array layer 21, an organic light-emitting layer 22, and a color filter layer 24.

In detail, the organic light-emitting layer 22 is arranged on the array layer 21, and the organic light-emitting layer 22 comprises at least one light-emitting unit 220. Accordingly, the array layer 21 comprises thin film transistors 210 arranged in an array. The light-emitting unit 220 is electrically connected to the thin film transistor 210 to be driven by the thin film transistor 210 to emit light. The specific arrangements and working principles of the array layer 21 and the organic light-emitting layer 22 can be referred to the prior art, and details are not further described in the embodiment of the present disclosure.

The color filter layer 24 is arranged on the organic light-emitting layer 22, and the color filter layer 24 comprises a photoresist structure 241 and at least one color resist unit 242, wherein the color resist unit 242 corresponds to the light-emitting unit 220. In detail, the color filter layer 24 comprises red (R), green (G), and blue (B) color resists, and the color resists correspond to red, green, and blue light-emitting units of the organic light-emitting layer 22 to form a color filter functional layer.

In a further embodiment, an OLED display panel 20 further comprises a thin film encapsulation layer 23, wherein the thin film encapsulation layer 23 covers the organic light-emitting layer 22 and the array layer 21, and the color filter layer 24 is formed at a side of the thin film encapsulation layer 23 away from the organic light-emitting layer 22.

As shown in FIG. 3 to FIG. 4, the photoresist structure 241 in the embodiment of the present disclosure comprises a first defining layer 31 and a second defining layer 32, wherein the first defining layer 31 comprises at least one first color resist defining area 311, and the second defining layer 32 comprises at least one second color resist defining area 321 at a position corresponding to the first color resist defining area 311. An opening D32 of the second color resist defining area 321 is larger than an opening D31 of the first color resist defining area 311, and the second defining layer 32 comprises a sloped surface 322 defined between the first color resist defining area 311 and the second color resist defining area 321. That is, a surface with a stepped shape is formed between the second defining layer 32 and the first defining layer 31. Because ink is printed into corresponding color resist defining areas using droplets in the ink-jet printing process, off-centered ink can flow into the color resist defining areas by the design of the sloped surface.

Referring to FIG. 2A again, the color resist unit 242 is formed in an area defined by the first color resist defining area 311 and the second color resist defining area 321 which are corresponding to the photoresist structure 241, and is corresponding to the light-emitting unit 220. In a further embodiment, the color resist unit 242 is formed in the area defined by the first color resist defining area 311 and the second color resist defining area 321 by ink-jet printing.

Referring to FIG. 3 to FIG. 4 again, in a further embodiment, an aperture parameter of the first color resist defining area 311 and an optical parameter of the color resist unit 242 are substantially the same. That is, the photoresist structure 241 in the embodiment of the present disclosure meets an optical parameter requirement for subsequent formation of RGB layers.

In a further embodiment, the first color resist defining area 311 and the second color resist defining area 321 have the same shapes and are concentric. The arrangement facilitates formation of the sloped surface, and the sloped surface can be formed all around the first color resist defining area 311, which is more convenient for the off-center ink to flow into the first color resist defining area 311.

In a further embodiment, shapes of the first color resist defining area 311 and the second color resist defining area 321 are selected from any or a combination of a circle, a rounded rectangle, and a square.

Continuing to refer to FIG. 3, in the embodiment, the first color resist defining area 311 of the first defining layer 31 have shapes comprising circles and rounded rectangles, specifically comprising a circular bank 311a, a first rounded rectangular bank 311b, and a second rounded rectangular bank 311c, and aperture parameters of the banks meet requirements of optical parameters for manufacturing corresponding color resist units. Accordingly, the second color resist defining area 321 of the second defining layer 32 have shapes comprising circles and rounded rectangles, specifically comprising a circular bank 321a, a first rounded rectangular bank 321b, and a second rounded rectangular bank 321c, and aperture parameters of the banks are larger than that of corresponding banks of the first color resist defining area 311 to meet requirements of ink-jet printing.

In an embodiment, a diameter of the circular bank 311a of the first defining layer 31 can range from 26 μm to 28 μm, a length of an edge of the first rounded rectangular bank 311b can range from 25 μm to 32 μm, and a length of an edge of the second rounded rectangular bank 311c can range from 27 μm to 37 μm. A diameter D301 of the corresponding circular bank 321a of the second defining layer 32 can range from 28 μm to 39 μm, a length L302 of an edge of the first rounded rectangular bank 321b can range from 45 μm to 46 μm, and a length L303 of an edge of the second rounded rectangular bank 321c can range from 45 μm to 46 μm, wherein the aperture parameters of the corresponding different rounded rectangular banks (the first rounded rectangular bank 321b and the second rounded rectangular bank 321c) can be the same to simplify the manufacturing process.

In an embodiment, materials of the first defining layer 31 and the second defining layer 32 both comprise a black matrix (BM) material. In detail, the BM material comprises ink. The two defining layers are formed by two masks, wherein the optical parameters are ensured by holes of a bottom mask, and the IJP requirements are satisfied by holes of a top mask.

In an embodiment, a material of the first defining layer 31 comprises a black matrix (BM) material, and a material of the second defining layer 32 comprises an over coat (OC) material. The BM material and the OC material both comprise epoxy resin, specifically, the BM material comprises black ink and the OC material comprises gelatinous resin.

In a further embodiment, the OC material and the BM material are both negative materials, and when same openings are exposed, an exposure of the OC material is greater than an exposure of the BM material. Specifically, the first defining layer 31 and the second defining layer 32 are formed by performing a halftone process through one mask and by exposing a first layer of the BM material and a second layer of the OC material at the same time. Due to the negative BM material and the consistent property of the OC material and the BM material, an opening of a layer of the BM material is smaller, caused by different exposing properties of the OC material and the BM material and a retention characteristic when negatively exposed under a same exposure, thereby forming the surface with the stepped shape to facilitate subsequent IJP.

In combination with FIG. 5 below, the photoresist structure in the embodiment of the present disclosure is further verified through an inkjet printing experiment.

In the photoresist structure with a stack of two defining layers, the ink is printed in corresponding color resist defining areas in the way of droplets in the printing process. Due to a certain gradient of the defining areas, the off-center ink can flow into the color resist defining areas zone, which not only meets the requirements of IJP printing, but also makes the color resist units of the printed color filter layer meet the requirements of subsequent optical parameters, as shown in part a in FIG. 5.

As a contrast, the photoresist structure with a single-layer defining layer is difficult to be sloped since a substrate layer is not too thick at the beginning of the design, and the color resist units formed by printing are easy to deviate from the defining area, which affects optical parameter requirements, as shown in part b in FIG. 5.

Based on the same inventive concept, an embodiment of the present disclosure also provides a display device.

Figure 6:
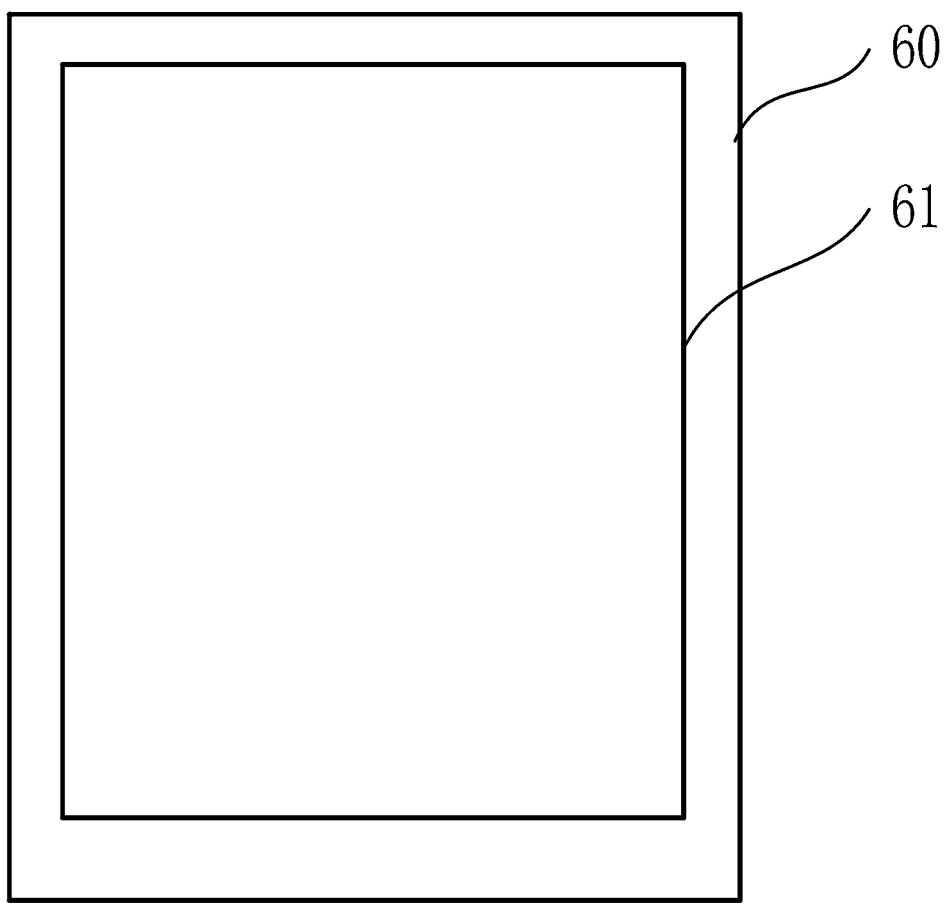
FIG. 6 is a structural schematic diagram illustrating a display device according to an embodiment of the present disclosure.

As shown in FIG. 6 which is a structural schematic diagram illustrating a display device according to an embodiment of the present disclosure, the display device 60 comprises a display panel 61 which is the OLED display panel mentioned above in the present disclosure. The arrangement and advantages are described in detail as the foregoing, and are not further described herein.

The display device in the embodiment of the present disclosure can comprise wearable devices such as smart bracelets, smart watches, and virtual reality (VR) devices, and can comprise mobile phones, e-books, electronic newspapers, televisions, personal laptops, flexible or rollable OLED displays, or lighting devices.

It can be understood that, for those skilled in the art, equivalent replacements and modifications can be made according to the technical solution and disclosure ideas thereof of the present disclosure, and all these modifications or replacements are considered within the protection scope of the attached claims of the present disclosure.

What is claimed is:

1. An organic light emitting diode (OLED) display panel, comprising:
    an array layer;
    an organic light emitting layer arranged on the array layer and comprising at least one light emitting unit; and
    a color filter layer arranged on the organic light emitting layer and comprising a photoresist structure and at least one color resist unit, and the photoresist structure comprising:
        a first defining layer, comprising at least one first color resist defining area; and
        a second defining layer, disposed on a side of the first defining layer away from the array layer and comprising a second color resist defining area at a position corresponding to the first color resist defining area,
    wherein the first color resist defining area and the second color resist defining area have a same shape and are concentric, an opening of the second color resist defining area is larger than an opening of the first color resist defining area, and the second defining layer comprises a sloped surface defined between the first color resist defining area and the second color resist defining area; and
    wherein the color resist unit is arranged in an area defined by the first color resist defining area and the second color resist defining area and corresponds to the light emitting unit.

2. The OLED display panel as claimed in claim 1, wherein each of the first color resist defining area and the second color resist defining area is in a shape selected from any one or combination of a circle, a rounded rectangle, and a square.

3. The OLED display panel as claimed in claim 1, wherein an aperture parameter of the first color resist defining area and an optical parameter of the color resist unit are substantially same.

4. The OLED display panel as claimed in claim 1, wherein materials of the first defining layer and the second defining layer both comprise a black matrix (BM) material.

5. The OLED display panel as claimed in claim 1, wherein a material of the first defining layer comprises a black matrix (BM) material, and a material of the second defining layer comprises an over coat (OC) material.

6. The OLED display panel as claimed in claim 5, wherein the OC material and the BM material are both negative materials, and when same openings are exposed, an exposure of the OC material is greater than an exposure of the BM material.

7. The OLED display panel as claimed in claim 5, wherein the first defining layer and the second defining layer are formed by performing a halftone process through one mask and by exposing a first layer of the BM material and a second layer of the OC material at the same time.

8. An organic light emitting diode (OLED) display panel, comprising:
    an array layer;
    an organic light emitting layer, arranged on the array layer and comprising at least one light emitting unit; and
    a color filter layer arranged on the organic light emitting layer and comprising a photoresist structure and at least one color resist unit, the photoresist structure comprising:
        a first defining layer, comprising at least one first color resist defining area; and
        a second defining layer, comprising a second color resist defining area at a position corresponding to the first color resist defining area,
    wherein an opening of the second color resist defining area is larger than an opening of the first color resist defining area, and the second defining layer comprises a sloped surface defined between the first color resist defining area and the second color resist defining area; and
    wherein the color resist unit is arranged in an area defined by the first color resist defining area and the second color resist defining area and corresponds to the light emitting unit.

9. The OLED display panel as claimed in claim 8, wherein the first color resist defining area and the second color resist defining area have a same shape and are concentric.

10. The OLED display panel as claimed in claim 8, wherein each of the first color resist defining area and the second color resist defining area is in a shape selected from any one or combination of a circle, a rounded rectangle, and a square.

11. The OLED display panel as claimed in claim 8, wherein an aperture parameter of the first color resist defining area and an optical parameter of the color resist unit are substantially same.

12. The OLED display panel as claimed in claim 8, wherein materials of the first defining layer and the second defining layer both comprise a black matrix (BM) material.

13. The OLED display panel as claimed in claim 8, wherein a material of the first defining layer comprises a black matrix (BM) material, and a material of the second defining layer comprises an over coat (OC) material.

14. The OLED display panel as claimed in claim 13, wherein the OC material and the BM material are both negative materials, and when same openings are exposed, an exposure of the OC material is greater than an exposure of the BM material.

15. The OLED display panel as claimed in claim 13, wherein the first defining layer and the second defining layer are formed by performing a halftone process through one mask and by exposing a first layer of the BM material and a second layer of the OC material at the same time.

16. A display device, comprising an organic light emitting diode (OLED) display panel, wherein the OLED display panel comprises:
an array layer;
an organic light emitting layer arranged on the array layer and comprising at least one light emitting unit; and
a color filter layer arranged on the organic light emitting layer and comprising a photoresist structure and at least one color resist unit, the photoresist structure comprising:
a first defining layer, comprising at least one first color resist defining area; and
a second defining layer, comprising a second color resist defining area at a position corresponding to the first color resist defining area,
wherein an opening of the second color resist defining area is larger than an opening of the first color resist defining area, and the second defining layer comprises a sloped surface defined between the first color resist defining area and the second color resist defining area; and
wherein the color resist unit is arranged in an area defined by the first color resist defining area and the second color resist defining area and corresponds to the light emitting unit.

17. The display device as claimed in claim 16, wherein the first color resist defining area and the second color resist defining area have same shapes and are concentric.

18. The display device as claimed in claim 16, wherein each of materials of the first defining layer and the second defining layer comprise a black matrix (BM) material; or a material of the first defining layer comprises a black matrix (BM) material, and a material of the second defining layer comprises an over coat (OC) material.

19. The OLED display panel as claimed in claim 8, wherein the second defining layer is disposed on a side of the first defining layer away from the array layer.

20. The display device as claimed in claim 16, wherein the second defining layer is disposed on a side of the first defining layer away from the array layer.

* * * * *